(12) United States Patent
Horii

(10) Patent No.: US 6,596,149 B2
(45) Date of Patent: Jul. 22, 2003

(54) MANUFACTURING METHOD FOR CAPACITOR HAVING ELECTRODE FORMED BY ELECTROPLATING

(75) Inventor: Hideki Horii, Suwon (KR)

(73) Assignee: Samsung Electronics Co., Ltd., Suwon (KR)

( * ) Notice: Subject to any disclaimer, the term of this patent is extended or adjusted under 35 U.S.C. 154(b) by 99 days.

(21) Appl. No.: 09/323,600

(22) Filed: Jun. 1, 1999

(65) Prior Publication Data

US 2001/0052466 A1 Dec. 20, 2001

(30) Foreign Application Priority Data

Jun. 8, 1998 (KR) .......................... 1998-21066

(51) Int. Cl.⁷ .............................. C25D 5/02; H01L 21/00
(52) U.S. Cl. ................. 205/123; 205/122; 205/170; 205/264; 205/265; 438/256; 438/399
(58) Field of Search .................. 205/122, 264, 205/118, 123, 170, 265; 438/3, 255, 256, 399

(56) References Cited

U.S. PATENT DOCUMENTS

| | | | | |
|---|---|---|---|---|
| 4,341,912 A | * | 7/1982 | Takahashi et al. | 585/443 |
| 4,427,502 A | * | 1/1984 | Abys | 205/242 |
| 5,316,974 A | * | 5/1994 | Crank | 437/190 |
| 5,685,968 A | * | 11/1997 | Hayakawa et al. | 205/122 |
| 5,731,216 A | * | 3/1998 | Holmberg | 437/40 |
| 5,780,323 A | * | 7/1998 | Forouhi et al. | 438/131 |
| 5,877,062 A | * | 3/1999 | Horii | 438/240 |
| 5,969,422 A | * | 10/1999 | Ting et al. | 257/762 |
| 6,043,146 A | * | 3/2000 | Watanabe et al. | 438/623 |
| 6,054,331 A | * | 4/2000 | Woo et al. | 438/3 |

* cited by examiner

*Primary Examiner*—Roy King
*Assistant Examiner*—William T. Leader
(74) *Attorney, Agent, or Firm*—Harness, Dickey & Pierce, P.L.C.

(57) ABSTRACT

A capacitor having an electrode formed by electroplating, and a manufacturing method thereof are disclosed. According to an embodiment of the invention, a conductive film is formed on a conductive plug connected to an active region of a semiconductor substrate, and on an interlayer dielectric (ILD) film formed around the conductive plug. Then, a non-conductive pattern exposing a part of the conductive film on the conductive plug is formed on the conductive film, and a lower electrode, which is formed of a platinum (Pt) group metal, is formed on the conductive film by electroplating. In addition, the lower electrode can have a rectangular, T-shaped, reverse trapezoid or barrel-shaped cross-section. Electroplating can similarly form an upper electrode of the capacitor.

27 Claims, 4 Drawing Sheets

MANUFACTURING METHOD FOR CAPACITOR HAVING ELECTRODE FORMED BY ELECTROPLATING

BACKGROUND OF THE INVENTION

1. Field of the Invention

The present invention relates to a semiconductor memory device and a manufacturing method thereof, and more particularly, to a capacitor having an electrode formed by electroplating, and a manufacturing method thereof.

2. Description of the Related Art

For the manufacture of a highly integrated dynamic random access memory (DRAM), methods have been suggested for thinning a dielectric film of a capacitor, to increase capacitance within a limited cell area, and for forming a lower electrode of the capacitor with a three-dimensional structure, to increase the effective area of the capacitor. Research has also actively pursued methods for replacing the dielectric film of the capacitor with a thin film having a high dielectric constant, for example, $(Ba,Sr)TiO_2$ (abbreviated BST), $PbZrTiO_3$ (abbreviated PZT) or $(Pb,La)(Zr,Ti)O_3$ (abbreviated PLZT) films. Such dielectric films can be formed in a capacitor in the same way as a conventional dielectric film such as ONO or $Ta_2O_5$ film. First, a buried contact (BC) for the capacitor is formed using a conductive plug such as a doped polysilicon plug, and a lower electrode is formed thereon. The dielectric material is deposited on the lower electrode.

A capacitor using the high dielectric film typically employs an electrode material belonging to the platinum (Pt) group or their oxides, e.g., Pt, iridium (Ir), ruthenium (Ru), ruthenium oxide ($RuO_2$) and iridium oxide ($IrO_2$), as a material for electrodes. Platinum, while having an excellent resistance to oxidation, has a high reactivity with silicon. Thus, when elements of the Pt group or their oxides are used as electrode materials, unwanted diffusion and reactions are likely to occur between the electrode material and the doped polysilicon plug. Thus, a barrier layer capable of preventing the reaction and diffusion is necessary between the lower electrode and the conductive plug.

A conventional method of forming a lower electrode forms a conductive film of a metal belonging to the Pt group, and then dry-etches the conductive film to form the electrode. However, accurately dry-etching a film formed of metals belonging to the Pt group is particularly difficult when forming a memory device having an electrode with a width of less than 300 nm, e.g., in a DRAM with a capacity of 4 Gbit or more. Better methods for forming small electrodes are sought.

SUMMARY OF THE INVENTION

According to an embodiment of the present invention, an integrated circuit manufacturing process uses electroplating to form an electrode. The process includes forming a conductive film on a conductive plug connected to an active region of a semiconductor substrate, and on an interlayer dielectric (ILD) film surrounding the conductive plug. Then, a non-conductive pattern, which exposes a part of the conductive film that is on the conductive plug, is formed. Electroplating forms a metal film of the platinum (Pt) group on the exposed conductive film.

In an exemplary embodiment, the conductive film contains a material selected from a group consisting of Pt group metals, Pt group metal oxides, conductive perovskites, and mixtures thereof. The non-conductive pattern is boro-phospho-silicate glass (BPSG), spin-on glass (SOG), phospho-silicate glass (PSG), plasma enhanced $SiH_4$ (PE-$SiH_4$) oxide, plasma enhanced tetra-ethyl-ortho-silicate (PE-TEOS) oxide, high density plasma $SiO_2$ (HDP-$SiO_2$), high temperature oxide (HTO) film, $SiO_x$, $SiN_x$, $SiON_x$, $TiO_x$, $AlO_x$, $AlN_x$, or a mixture thereof. The lower electrode is Pt, Ir, Ru, Rh, Os, Pd, or a mixture thereof.

Manufacturing a capacitor further may include forming of a diffusion barrier film on the conductive plug and the ILD film before forming the conductive film. The conductive film would then be formed on the diffusion barrier film.

The lower electrode can have a rectangular cross-section, a T-shaped cross-section or a trapezoidal cross-section with a widest side on top. The cross-section of the lower electrodes depend on the shape of the side walls of openings in the non-conductive pattern and the time and rate of the electroplating.

The method according to the present invention may further include, after the forming of the lower electrode, removing of the non-conductive pattern and the conductive film to expose the ILD film. Then, a dielectric film is formed on the lower electrode, and an upper electrode formed on the dielectric film.

Preferably, the dielectric film is contains $Ta_2O_5$, $SrTiO_3$ (STO), $(Ba,Sr)TiO_3$ (BST), $PbZrTiO_3$ (PZT), $SrBi_2Ta_2O_9$ (SBT), $(Pb,La)(Zr,Ti)O_3$, $Bi_4Ti_3O_{12}$, or a mixture thereof. The upper electrode can be formed by chemical vapor deposition (CVD) or sputtering. Alternatively, the upper electrode may be formed by forming a seed layer on the dielectric film and then electroplating a Pt group metal film on the seed layer.

The method according to the present invention may further include forming a diffusion barrier layer film under the conductive film and removing the non-conductive pattern to the extent that the ILD film is exposed, after the forming of the lower electrode. At the same time, the conductive layer and the diffusion barrier film under the exposed conductive layer are removed. Spacers covering the side walls of the diffusion barrier film are formed on the exposed ILD film, and a dielectric film may be formed on the lower electrode and the ILD film. Then, an upper electrode may be formed on the dielectric film. Preferably, the spacers are SOG, HDP-$SiO_2$, PE-$SiH_4$, PE-TEOS, $SiN_x$, $SiON_x$, BPSG or PSG.

In accordance with another aspect of the present invention, a capacitor for a semiconductor memory device is formed using the above method. A lower electrode of the capacitor has a rectangular, T-shaped, trapezoidal or barrel-shaped cross-section. The electroplating makes it possible to form a lower electrode having various shapes.

BRIEF DESCRIPTION OF THE DRAWINGS

The present invention will become more apparent by describing embodiments thereof with reference to the attached drawings in which.

DESCRIPTION OF THE PREFERRED EMBODIMENTS

Figure 1A:
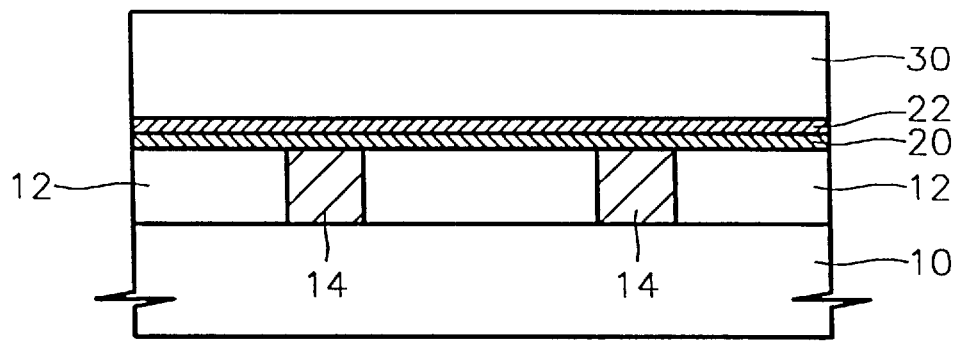
FIGS. 1A through 1F are sectional views of semiconductor structures illustrating a method of forming a capacitor according to an embodiment of the present invention.

Referring to FIG. 1A, a diffusion barrier film 20 and a conductive film 22 are formed in sequence on conductive plugs 14 connected to an active region of a semiconductor substrate 10 and an interlayer dielectric (ILD) film 12 surrounding conductive plugs 14, and a non-conductive film 30 is formed on the conductive film 22.

As the semiconductor substrate 10, various materials such as Si, GaAs or InP can be used. Also, the substrate 10 may include a pattern such as metal line instead of conductive plugs 14 for connection to lower electrodes of capacitors.

The diffusion barrier film 20 prevents reactions and diffusion between lower electrodes 40 (FIG. 1C) and conductive plugs 14, and simultaneously improves adhesion between lower electrodes 40 and conductive plugs 14. Diffusion barrier film 20 may be formed of a metal nitride. e.g., TiN, TaN, WN, TiSiN, TiAlN, TiBN, ZrSiN, ZrAlN, MoSiN, MoAlN, TaSiN and TaAlN, or a metal silicide such as $WSi_x$, $TiSi_x$, $MoSi_x$, $TaSi_x$, or $CoSi_x$, or a mixture thereof. For example, an approximately 10 nm thick TiN film can be formed by a direct current (DC) sputtering method under the conditions of a DC power of 1,000W, argon (Ar) gas flow rate of 40 sccm, $N_2$ flow rate of 40 sccm, and a wafer temperature of 200° C.

Conductive film 22 is a seed layer for forming lower electrode 40 in a following step, and is formed of a conductive material which has an excellent resistance to oxidation, e.g., a metal belonging to Pt group such as Platinum, rhodium (Rh), ruthenium (Ru), iridium (Ir), osmium (Os) or palladium (Pd), a Pt group metal oxide such as $PtO_x$, $RhO_x$, $RuO_x$, $IrO_x$, $OsO_x$ or $PdO_x$, or a conductive perovskite material such as $CaRuO_3$, $SrRuO_3$, $BaRuO_3$, $BaSrRuO_3$, $CaIrO_3$, $SrIrO_3$, $BaIrO_3$ or $(La,Sr)CoO_3$. When the conductive film 22 is formed of Ru, the Ru film is deposited to a thickness of approximately 10 nm using a DC sputtering apparatus under a DC power of 1,000W, an Ar gas flow rate of 20 sccm, and a wafer temperature of 200° C.

On conductive film 22, a non-conductive film 30 is formed to a thickness selected according to the desired thickness of lower electrodes 40 to be formed.

Non-conductive film 30 may be formed of boro-phosphosilicate glass (BPSG), spin-on glass (SOG), plasma enhanced $SiH_4$ (PE-$SiH_4$), plasma enhanced tetra-ethyl-ortho-silicate (PE-PEOS), high density plasma $SiO_2$ (HDP-$SiO_2$), high temperature oxidation (HTO) film, phosphosilicate glass (PSG), $SiO_x$, SiNe, $SiON_x$, $TiO_x$, $AlO_x$ or $AlN_x$, or a mixture thereof. The materials for non-conductive film 30 do not dissolve in a plating solution, which is a strong acid and is maintained at a high temperature, and are highly unlikely to collapse when patterned. According to the present embodiment, a PE-TEOS film is deposited to a thickness of 300 nm using a TEOS source by chemical vapor deposition (CVD).

Figure 1B:
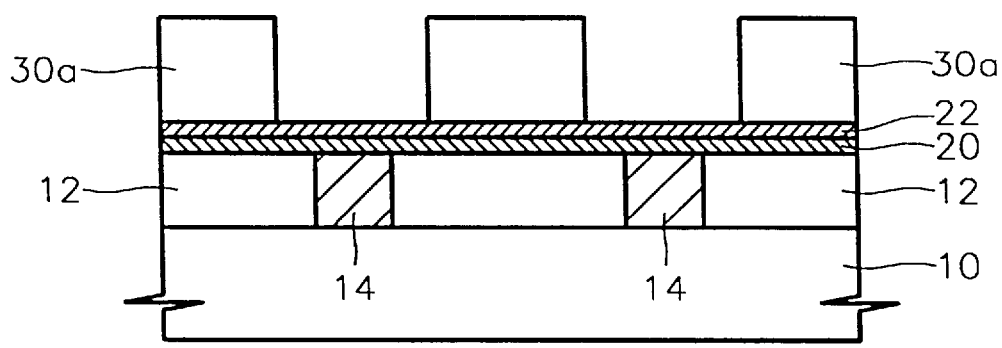

Referring to FIG. 1B, non-conductive film 30 is selectively removed to produce a non-conductive pattern 30a by a photolithography and a reactive ion etching (RIE) method using $C_4F_8$ gas and $O_2$ gas, so that a part of conductive film 22 on conductive plug 14 is exposed.

Figure 1C:
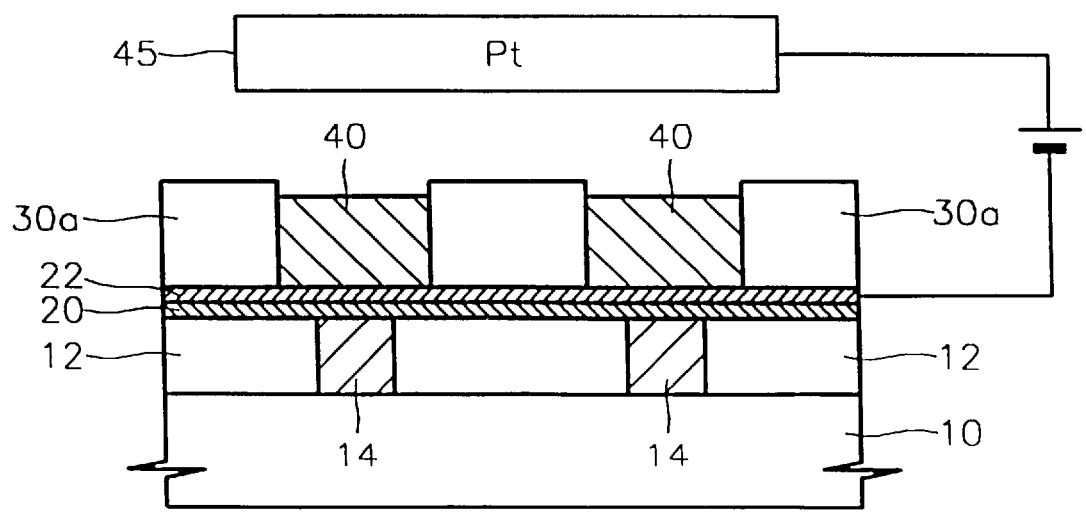

Referring to FIG. 1C, in order to form lower electrodes 40 on the exposed parts of conductive film 22, after connecting conductive film 22 to a cathode and a Pt electrode 45 to an anode, the structure of FIG. 1B is soaked in a plating solution containing ammonium platinum nitrite ($Pt(NH_3)_2(NO_2)_2$) for electroplating of Pt. As a result of electroplating, Pt film 40 forms only on the exposed conductive film 22, e.g., the cathode for electroplating, while no Pt film is formed on the non-conductive pattern 30a. An electroplating, where the plating time is 150 seconds, the temperature of a plating bathtub is 80° C., the concentration of the plating solution is 10 g/l, the pH of the plating solution is 1.0, the concentration of conductive salt sulfuric acid in the plating solution is 1 g/l, and the current density is 1 $A/dm^2$, may produce an approximately 500 nm thick Pt lower electrode 40.

Ammonium chloroplatinate $((NH_4)_2PtCl_6)$, or chloroplatinic acid $(H_2PtCl_6)$ also may be used as the plating solution. When a plating solution contains a Pt group metal salt other than Pt, a metal film corresponding to the Pt group metal salt, instead of the Pt, forms on the exposed part of conductive film 22. For example, the plating solution may contain a metal salt of Pt, Ir, Ru, Rh, Os and Pd, or a mixture thereof.

Figure 1D:
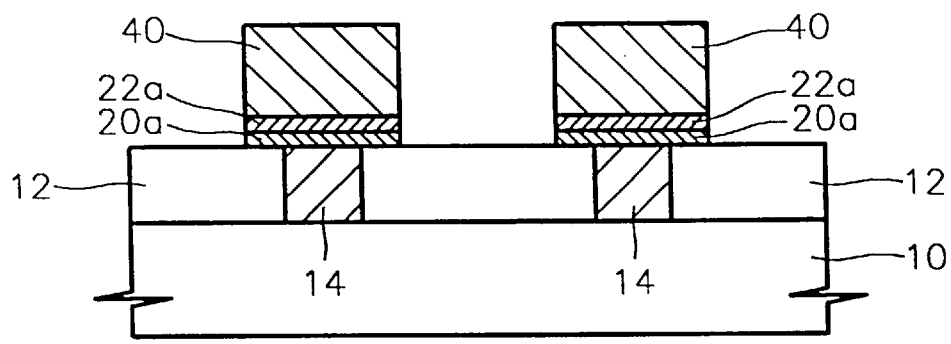

Referring to FIG. 1D, after the formation of lower electrode 40 by electroplating, non-conductive pattern 30a, and conductive film 22 and diffusion barrier film 20 below non-conductive pattern 30a, are removed by a wet or dry etching using lower electrode 40 as an etching mask. The etching partially exposes ILD film 12. As a result, a diffusion barrier film pattern 20a, a conductive film pattern 22a and Pt lower electrode 40 are stacked in sequence on conductive plug 14. Here, lower electrode 40 has a rectangular cross-section.

Figure 1E:
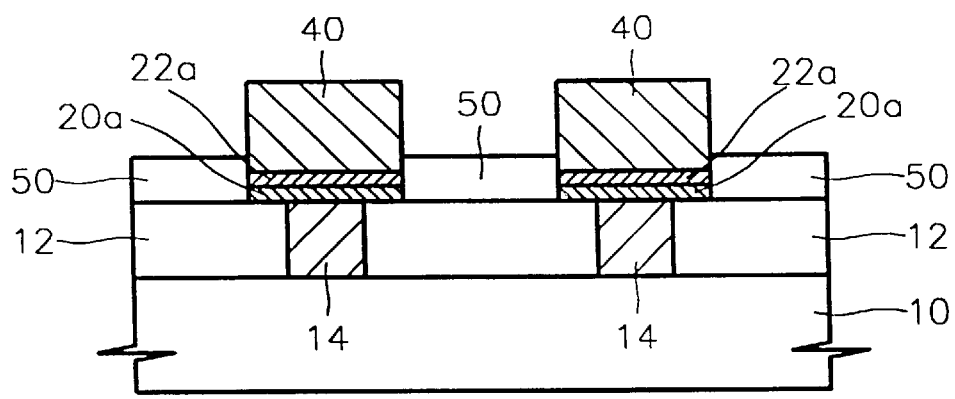

Referring to FIG. 1E, in order to prevent diffusion of oxygen through the side walls of diffusion barrier film pattern 20a during formation of a dielectric film 60 (FIG. 1F) in a following step, spacers 50 are formed on exposed ILD film 12, to cover the side walls of diffusion barrier film pattern 20a. As a result, spacers 50 fill the spaces between electrodes 40 to a level higher than conductive film pattern 22a. Even though spacers 50 are useful, spacers 50 can be omitted.

In forming spacers 50, a material having excellent filling characteristics, such as SOG, HDP-$SiO_2$, PE-$SiH_4$, PE-TEOS, $SiN_x$, $SiON_x$, BPSG or PSG, is deposited on the structure of FIG. 1D, thereby completely filling the spaces between electrodes 40 and covering electrodes 40. Then, the deposited material for forming spacers 50 is removed by a chemical mechanical polishing (CMP) method until the top surface of electrode 40 is exposed. Then, a dry etching method partially removes the remaining spacer material, leaving spacers 50. Alternatively, the spacer forming material film may be etched back to form spacers 50.

Figure 1F:
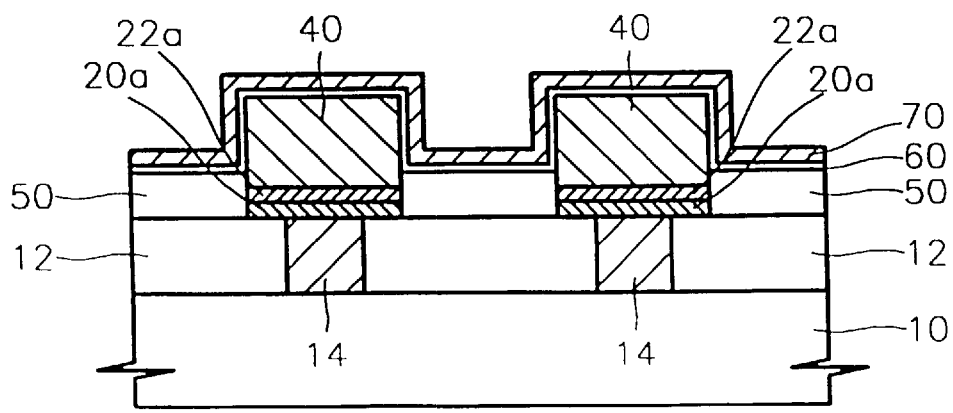

Referring to FIG. 1F, a CVD or sputtering method deposits a dielectric material and a conductive material sequentially on the structure of FIG. 1E to form a dielectric film 60 and an upper electrode 70, respectively. Dielectric film 60 may be $Ta_2O_5$, $SrTiO_3$ (abbreviated STO), $(Ba,Sr)TiO_3$ (abbreviated BST), $PbZrTiO_3$ (abbreviated PZT), $SrBi_2Ta_2O_9$ (abbreviated SBT), $(Pb,La)(Zr,Ti)O_3$ and $Bi_4Ti_3O_{12}$, or a mixture thereof. Upper electrode 70 may be formed of a metal belonging to the Pt group, such as Pt, Rh, Ru, Ir, Os or Pd, a Pt group metal oxide, such as $PtO_x$, $RhO_x$, $RuO_x$, $IrO_x$, $OsO_x$ or $PdO_x$, or a conductive perovskite such as $CaRuO_3$, $SrRuO_3$, $BaRuO_3$, $BaSrRuO_3$, $CaIrO_3$, $SrIrO_3$, $BaIrO_3$, $(La,Sr)CoO_3$, or a mixture thereof.

Although upper electrode 70 can be formed by a deposition method, the present invention is not limited to deposition methods. In particular, upper electrode 70 can be formed by electroplating, as was the lower electrode 40.

Figure 2:
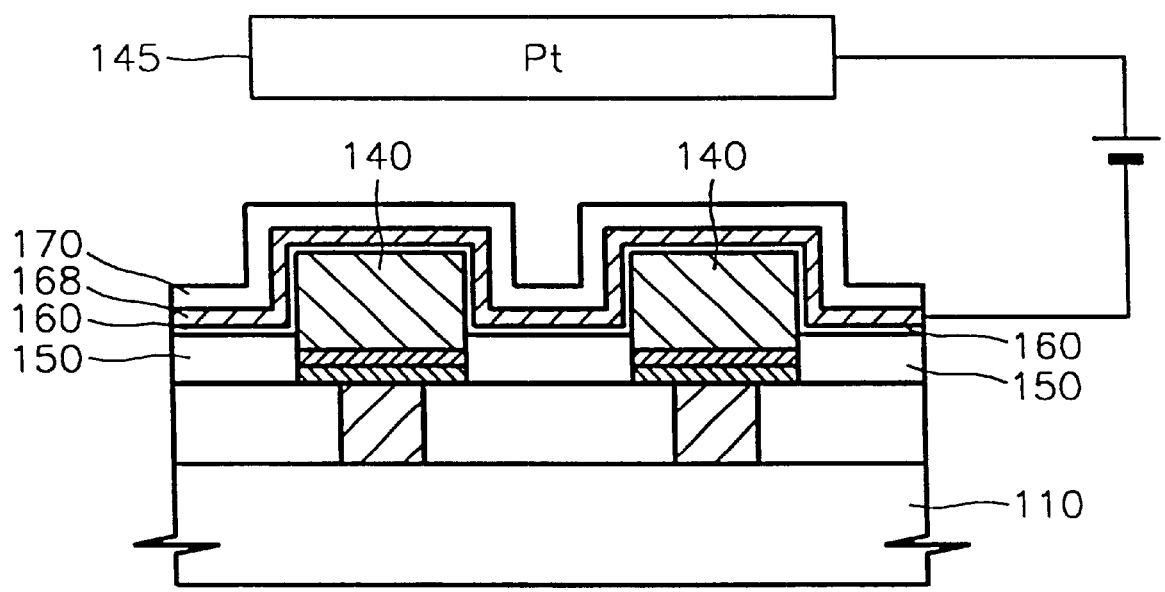
FIG. 2 is a sectional view of a semiconductor capacitor illustrating a method of forming an upper electrode of the capacitor according to another embodiment of the present invention.

FIG. 2 is a cross-sectional view of a semiconductor capacitor illustrating a method of forming an upper electrode of the capacitor by electroplating. In forming upper electrode 170 by electroplating, after a dielectric film 160 is formed on the structure of FIG. 1E by the same method of forming dielectric film 60 of FIG. 1F. A CVD or sputtering method forms a seed layer 168 that is approximately 10 nm thick on dielectric film 160. Seed layer 168 is formed of a material containing a material of an upper electrode 170 to be formed on seed layer 168. In this embodiment, seed layer 168 is formed of Pt. Alternatively, seed layer 168 can be formed of one of the materials for diffusion barrier film 20 of FIG. 1A An electroplating method connects seed layer 168 to a cathode, connects a Pt electrode 145 to an anode, and soaks substrate 110 in a plating solution containing ammonium platinum nitrite ($Pt(NH_3)_2(NO_2)_2$). As a result, a Pt upper electrode 170 forms on seed layer 168.

Here, electroplating for 150 seconds while the temperature of the plating bathtub is 80° C., the concentration of the plating solution is 10 g/l, the pH of the plating solution is 1.0, the concentration of conductive salt sulfuric acid in the plating solution is 1g/l, and the current density is 1 $A/dm^2$, results in Pt upper electrode 170 having a thickness of approximately 100 nm.

As the plating solution, ammonium chloroplatinate (($NH_4)_2PtCl_6$) or chloroplatinic acid ($H_2PtCl_6$) may also be used, instead of ammonium platinum nitrite ($Pt(NH_3)_2(NO_2)_2$). Also, a plating solution that contains another Pt group metal salt may be used to form a metal film corresponding to the other metal salt, instead of the Pt film. The plating solution may contain a metal salt of Pt group metal, that is, Pt, Ir, Ru, Rh, Os and Pd, or a mixture thereof.

As aspect ratio increases and node size decreases in a semiconductor integrated circuit, a CVD or sputtering method is likely to produce an upper electrode having a poor step coverage, and thus the upper electrode may not be formed on the entire surface of the wafer. However, the electroplating method in accordance with the embodiment illustrated in FIG. 2 can produce an upper electrode having a good step coverage, and thus the upper electrode forms on the entire surface of the wafer. As the thickness of the upper electrode increases, the space between the lower electrodes is completely filled and the upper electrode is planarized.

In the above embodiments, although the lower electrode 40 or 140 has a rectangular cross-section, other cross-sectional shapes are also available in the present invention. In the conventional method where a conductive film is deposited and then dry-etched to form a lower electrode, the lower electrode is confined to have a rectangular cross-section. However, the electroplating method according to the present invention can form the lower electrodes having various shapes that the dry etching method cannot obtain. For example, with a thick non-conductive film, a thick lower electrode can form.

Figure 3A:
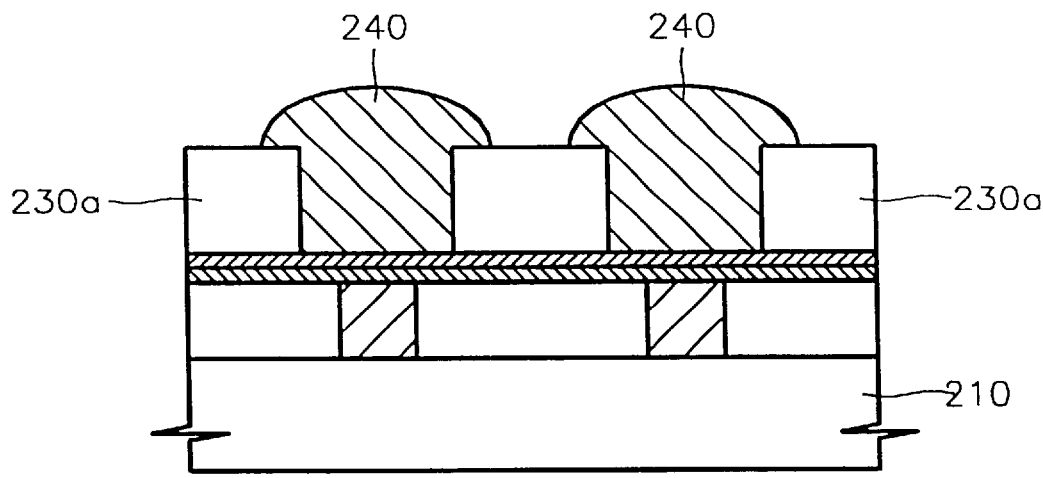
FIGS. 3A through 3C are sectional views of various shapes of lower electrodes according to the present invention.
Figure 3B:
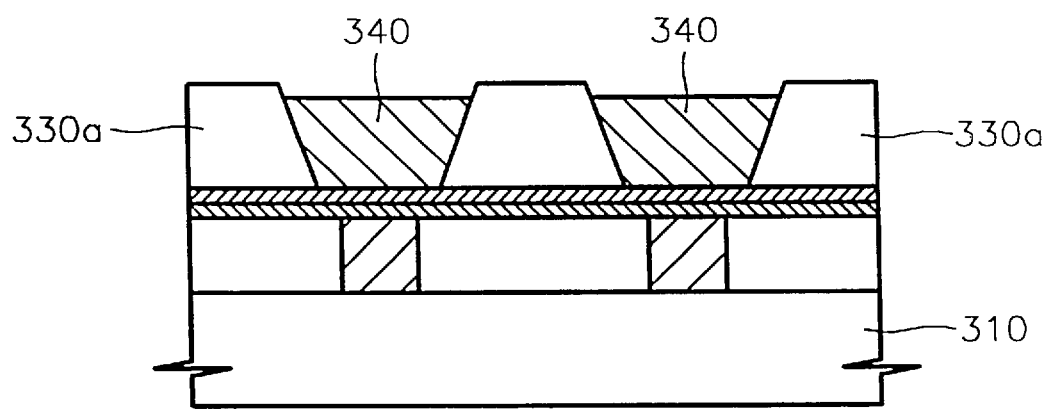
Figure 3C:
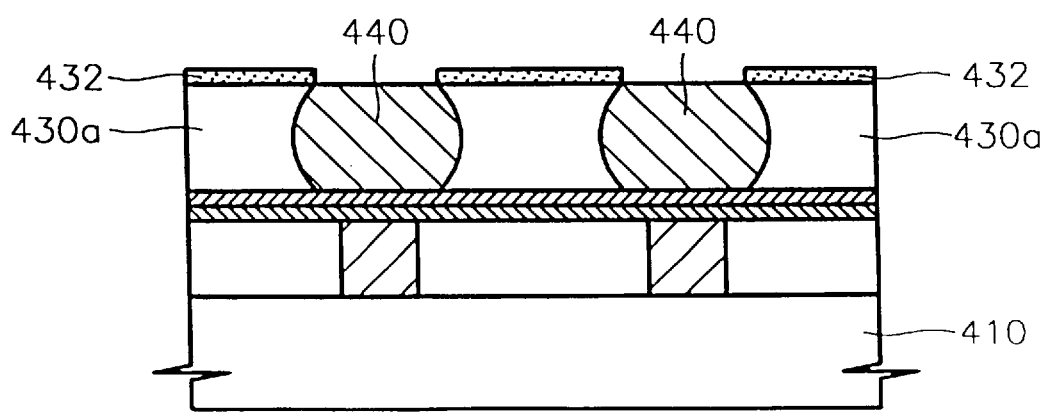

FIGS. 3A through 3C are cross-sectional views of lower electrodes that can be formed by the electroplating according to the present invention. Referring to FIG. 3A, a lower electrode 240 having a T-shaped cross-section forms when the electroplating time is long enough to fill an opening in a patterned non-conductive layer 230a and begin plating on a top surface of non-conductive layer 230a. As shown in FIG. 3B, using a non-conductive pattern 330a having slanted side walls can form a lower electrode 340 having a trapezoidal cross-section with a widest side at the top.

Referring FIG. 3C, a lower electrode 440 having a barrel-shaped cross-section can be formed. In order to form a barrel-shaped cross-section, a mask pattern 432, e.g. a $TiO_2$ film, is formed on a non-conductive film, e.g., a $SiO_2$ film, and then the non-conductive film where exposed by mask pattern 432 is etched by a wet etching method using a hydrogen fluoride (HF) etchant. As a result, mask pattern 432 which is insoluble in the HF etchant remains, and only the exposed portion of the non-conductive film is etched, so that a non-conductive pattern 430a having barrel-shaped openings is formed. Then, electroplating forms a lower electrode 440 having a barrel-shaped cross-section.

The conventional method which forms the lower electrode by depositing a conductive film and then dry-etching the deposited conductive film cannot produce the lower electrode having a trapezoid cross-section or a barrel-shaped cross-section as shown in FIGS. 3B and 3C. Another advantage of the invention is that the electroplating method is commonly used in industry and is cost-effective. In addition, the electroplating method can form the capacitor electrodes of an alloy.

While the present invention has been illustrated and described with reference to specific embodiments, further modifications and alterations are within the spirit and scope of this invention as defined in the following claims.

What is claimed is:

1. A method of manufacturing a capacitor of a semiconductor memory device, comprising:
   (a) forming a conductive film on a conductive plug that connects to an active region of a semiconductor substrate, and on an interlayer dielectric (ILD) film that is around the conductive plug;
   (b) forming a non-conductive pattern on the conductive film, the non-conductive pattern exposing a part of the conductive film, the part being on the conductive plug, the non-conductive pattern being formed of one selected from a group consisting of boro-phospho-silicate glass (BPSG), spin-on glass (SOG), phospho-silicate glass (PSG), plasma enhanced $SiH_4$ (PE-$SiH_4$) oxide, plasma enhanced tetra-ethyl-ortho-silicate (PE-TEOS) oxide, high density plasma $SiO_2$ (HDP-$SiO_2$), high temperature oxide (HTO) film, $SiO_x$, $SiN_x$, $SiON_x$, $TiO_x$, $AlO_x$, $AlN_x$, and mixtures thereof;
   (c) immersing the semiconductor substrate, the conductive film, and the non-conductive pattern in an aqueous plating solution; and
   (d) forming a metal film of a platinum (Pt) group metal on the exposed part of the conductive film by an electroplating method in which the non-conductive pattern controls an area electroplated to form a lower electrode of the capacitor.

2. The method of claim 1, wherein the conductive film is formed of one selected from a group consisting of Pt group metals, Pt group metal oxides, conductive perovskites, and mixtures thereof.

3. The method of claim 2, wherein the conductive film is formed of one selected from a group consisting of platinum (Pt), rhodium (Rh), ruthenium (Ru), iridium (Ir), osmium (Os), palladium (Pd), $PtO_x$, $RhO_x$, $RuO_x$, $IrO_x$, $OsO_x$, $PdO_x$, $CaRuO_3$, $SrRuO_3$, $BaRuO_3$, $BaSrRuO_3$, $CaIrO_3$, $SrIrO_3$, $BaIrO_3$, $(La,Sr)CoO_3$, and mixtures thereof.

4. The method of claim 1, wherein the lower electrode is formed of one selected from a group consisting of Pt, Ir, Ru, Rh, Os, Pd, and mixtures thereof.

5. The method of claim 1, wherein the plating solution is selected from a group consisting of ammonium platinum nitrite ($Pt(NH_3)_2(NO_2)_2$), ammonium chloroplatinate (($NH_4)_2PtCl_6$) and chloroplatinic acid ($H_2PtCl_6$).

6. The method of claim 1, wherein the lower electrode is formed to have a rectangular cross-section.

7. The method of claim 1, wherein the lower electrode has a T-shaped cross-section perpendicular to the semiconductor substrate.

8. The method of claim 1, wherein the non-conductive pattern is formed to have a slanted side wall with respect to a direction perpendicular to the conductive film.

9. The method of claim 8, wherein the lower electrode has a trapezoid cross-section that is widest on top and perpendicular to the substrate.

10. The method of claim 1, wherein the lower electrode has a barrel-shaped cross-section perpendicular to the semiconductor substrate.

11. The method of claim 1, further comprising:
(e) removing the non-conductive pattern and the conductive film under the non-conductive pattern to partially expose the ILD film;
(f) forming a dielectric film on the lower electrode and the exposed ILD film; and
(g) forming an upper electrode on the dielectric film.

12. The method of claim 11, wherein the dielectric film is formed of one selected from a group consisting of $Ta_2O_5$, $SrTiO_3$ (STO), $(Ba,Sr)TiO_3$ (BST), $PbZrTiO_3$ (PZT), $SrBi_2Ta_2O_9$ (SBT), $(Pb,La)(Zr,Ti)O_3$, $Bi_4Ti_3O_{12}$, and mixtures thereof.

13. The method of claim 11, wherein the upper electrode is formed by chemical vapor deposition (CVD) or sputtering.

14. The method of claim 13, wherein the upper electrode is formed of one selected from a group consisting of Pt group metals, Pt group metal oxides, conductive perovskites, and mixtures thereof.

15. The method of claim 14, wherein the upper electrode is formed of one selected from a group consisting of platinum (Pt), rhodium (Rh), ruthenium (Ru), iridium (Ir), osmium (Os), palladium (Pd), $PtO_x$, $RhO_x$, $RuO_x$, $IrO_x$, $OsO_x$, $PdO_x$, $CaRuO_3$, $SrRuO_3$, $BaRuO_3$, $BaSrRuO_3$, $CaIrO_3$, $SrIrO_3$, $BaIrO_3$, $(La,Sr)CoO_3$, and mixtures thereof.

16. The method of claim 11, wherein the step (g) comprises:
(g-1) forming a conductive seed layer on the dielectric film;
(g-2) immersing the semiconductor substrate, the lower electrode, and the dielectric film in an aqueous plating solution; and
(g-3) forming the upper electrode by electroplating a Pt group metal on the seed layer.

17. The method of claim 16, wherein the seed layer is formed by chemical vapor deposition (CVD) or sputtering.

18. The method of claim 16, wherein the seed layer is formed of one selected from a group consisting of Pt group metals, Pt group metal oxides, conductive perovskites, and mixtures thereof.

19. The method of claim 18, wherein the seed layer is formed of one selected from the group consisting of platinum (Pt), rhodium (Rh), ruthenium (Ru), iridium (Ir), osmium (Os), palladium (Pd), $PtO_x$, $RhO_x$, $RuO_x$, $IrO_x$, $OsO_x$, $PdO_x$, $CaRuO_3$, $SrRuO_3$, $BaRuO_3$, $BaSrRuO_3$, $CaIrO_3$, $SrIrO_3$, $BaIrO_3$, $(La,Sr)CoO_3$, and mixtures thereof.

20. The method of claim 16, wherein the upper electrode is formed of one selected from a group consisting of Pt, Ir, Ru, Rh, Os, Pd, and mixtures thereof.

21. The method of claim 16, wherein the upper electrode is formed of Pt and the plating solution used for the electroplating is one selected from a group consisting of ammonium platinum nitrite ($Pt(NH_3)_2(NO_2)_2$), ammonium chloroplatinate (($NH_4)_2PtCl_6$) and chloroplatinic acid ($H_2PtCl_6$).

22. The method of claim 1, further comprising forming a diffusion barrier film on the conductive plug and the ILD film before the step (a),
wherein the conductive film is formed on the diffusion barrier film in the step (a).

23. The method of claim 22, wherein the diffusion barrier film is formed of one selected from a group consisting of metal nitride, metal silicide, and mixtures thereof.

24. The method of claim 23, wherein the diffusion barrier film is formed of one selected from a group consisting of TiN, TaN, WN, TiSiN, TiAlN, TiBN, ZrSiN, ZrAlN, MoSiN, MoAlN, TaSiN, TaAlN, $WSi_x$, $TiSi_x$, $CoSi_x$, $MoSi_x$, $TaSi_x$, and mixtures thereof.

25. The method of claim 22, further comprising:
(e) removing the non-conductive pattern, and the conductive film and the diffusion barrier film under the non-conductive pattern to the extent the ILD film is exposed;
(f) forming a spacer on the exposed ILD film, the spacers covering the exposed side wall of the diffusion barrier film;
(g) forming a dielectric film on the lower electrode and the spacer; and
(h) forming an upper electrode on the dielectric film.

26. The method of claim 25, wherein the spacer is formed of one selected from a group consisting of SOG, $HDP-SiO_2$, $PB-SiH_4$, PE-TEOS, $SiN_x$, $SiON_x$, BPSG and PSG.

27. The method of claim 25, wherein the step (h) comprises:
(h-1) forming a conductive seed layer on the dielectric film, using a conductive material; and
(h-2) forming the upper electrode by electroplating a Pt group metal on the seed layer.

* * * * *